United States Patent
Nikolaidis et al.

(10) Patent No.: US 11,778,753 B2
(45) Date of Patent: Oct. 3, 2023

(54) UV FIXING GLUE FOR ASSEMBLY

(71) Applicant: Heraeus Deutschland GmbH & Co. KG, Hanau (DE)

(72) Inventors: Ilias Nikolaidis, Hanau (DE); Alexander Zimmermann, Hanau (DE); Thomas Lauinger, Hanau (DE)

(73) Assignee: Heraeus Deutschland Gmbh & Co. KG, Hanau (DE)

( * ) Notice: Subject to any disclaimer, the term of this patent is extended or adjusted under 35 U.S.C. 154(b) by 324 days.

(21) Appl. No.: 17/004,612

(22) Filed: Aug. 27, 2020

(65) Prior Publication Data
US 2021/0068263 A1 Mar. 4, 2021

(30) Foreign Application Priority Data

Aug. 27, 2019 (EP) ..................................... 19193879

(51) Int. Cl.
| | |
|---|---|
| *H05K 1/03* | (2006.01) |
| *H05K 1/09* | (2006.01) |
| *H05K 3/00* | (2006.01) |
| *H05K 3/02* | (2006.01) |
| *H01L 23/48* | (2006.01) |
| *H05K 3/32* | (2006.01) |
| *B05D 3/06* | (2006.01) |
| *H01L 23/00* | (2006.01) |

(52) U.S. Cl.
CPC ............. *H05K 3/321* (2013.01); *B05D 3/067* (2013.01); *H01L 24/48* (2013.01); *H01L 24/83* (2013.01); *H05K 2203/0278* (2013.01)

(58) Field of Classification Search
CPC ........ H05K 1/03; H05K 1/0268; H05K 3/225; H05K 3/321; H05K 3/323; H05K 3/361;
(Continued)

(56) References Cited

U.S. PATENT DOCUMENTS

| | | | |
|---|---|---|---|
| 4,861,087 A * | 8/1989 | Park ..................... | B25J 15/0253 294/119.1 |
| 5,138,397 A * | 8/1992 | Dastin ................ | G03G 15/0131 399/304 |

(Continued)

FOREIGN PATENT DOCUMENTS

WO 2004/006178 1/2004

OTHER PUBLICATIONS

Yacobi, et al. "Adhesive Bonding in Microelectronics and Photonics", Journal of Applied Physics, 2002, vol. 91, pp. 6227-6262.

Primary Examiner — Xiaoliang Chen
(74) Attorney, Agent, or Firm — Dicke, Billig & Czaja, PLLC

(57) ABSTRACT

One aspect relates to a method of manufacture of an electronic assembly comprising at least these steps: providing a substrate having at least a first contact area; positioning a spot of a UV curable substance on the substrate; positioning an electrically conductive item on the substrate wherein the electrically conductive item is superimposed on the first contact area and on the spot of curable substance; exposing the UV curable substance to UV irradiation, wherein a mechanical connection between the electrically conductive item and substrate is formed; and optionally connecting the first contact area with the electrically conductive item. One aspect relates to an electronic assembly comprising a substrate with a contact area, a spot of a cured substance on the substrate and an electrically conductive item that is in electrically conductive connection with the first contact area and mechanically connected through the spot of cured substance to the substrate.

6 Claims, 4 Drawing Sheets

(58) Field of Classification Search
CPC . H05K 2201/0394; H05K 2201/10303; H05K 2201/10681; H05K 2201/10992; H05K 2203/0207; H05K 2203/0047; H05K 1/09; H05K 1/092; H05K 3/00; H05K 3/0002; H05K 3/02; B65D 3/067; H01L 23/4985; H01L 23/49883; H01L 24/48; H01L 24/83
USPC ........... 361/760; 349/150, 187; 53/228, 441, 53/466, 556
See application file for complete search history.

(56) References Cited

U.S. PATENT DOCUMENTS

| | | | | |
|---|---|---|---|---|
| 5,375,003 | A * | 12/1994 | Hirai | G02F 1/13452 445/24 |
| 5,473,861 | A * | 12/1995 | Fukunaga | B65B 11/54 53/228 |
| 6,528,352 | B1 * | 3/2003 | Jackson | G01R 1/0408 438/118 |
| 10,859,598 | B1 * | 12/2020 | Campbell | H05K 1/0268 |
| 2002/0166858 | A1 * | 11/2002 | Ogishima | B65B 11/54 206/467 |
| 2004/0195576 | A1 * | 10/2004 | Watanabe | H01L 33/62 257/79 |
| 2004/0239348 | A1 * | 12/2004 | Barr | G01R 1/06711 324/754.02 |
| 2005/0155706 | A1 * | 7/2005 | Nishida | H01L 21/563 257/E21.511 |
| 2006/0097911 | A1 | 5/2006 | Bussiere et al. | |
| 2011/0006418 | A1 | 1/2011 | Watanabe et al. | |
| 2011/0265675 | A1 * | 11/2011 | Barthelme | B41F 33/14 101/477 |
| 2018/0196346 | A1 * | 7/2018 | Son | H10K 50/814 |
| 2018/0340956 | A1 * | 11/2018 | Campbell | G01R 1/06755 |
| 2020/0180831 | A1 * | 6/2020 | Porto | B65D 21/022 |

\* cited by examiner

UV FIXING GLUE FOR ASSEMBLY

CROSS-REFERENCE TO RELATED APPLICATION

This Utility Patent Application claims priority to European Patent Application No. 19193879.4, filed Aug. 27, 2019, which is incorporated herein by reference.

TECHNICAL FIELD

One aspect relates pick and place mounting processes of electronic parts, in particular where electronic components are sold out on a printed circuit board (PCB).

BACKGROUND

Pick and place mounting processes are quite common in nowadays assembly of electronic parts, in particular where electronic components are sold out on a printed circuit board (PCB). These mounting processes work at high speed. Usually, larger components may be temporarily adhered to the PCB using wet solder paste or by using small blobs of a special adhesive applied by a glue dispensing machine. Accordingly, the spot of glue is transferred to the PCB before the component is placed. The glue will be burnt and decomposed during further treatment in the fixating process, e.g. when the soldering material is cured thermally. In summary, temporarily fixating components with glue is done solely to secure the position of larger components and the glue is removed in the finally mounted PCB.

However, the inventors identified that accurate positioning of electronic parts is not only an issue with larger components. To the contrary, this is also an issue when it comes to small and flexible parts, such as, e.g. thin elastic wire. The mounting of these flexible parts lacks precision which is disadvantageous in many circumstances, e.g. miniaturization of circuitry. Thus, there is a growing need to ensure accurate positioning and mounting of such smaller and lighter parts.

In general terms, it is an object of the present embodiment to at least partly overcome at least one disadvantage known from the prior art.

SUMMARY

One aspect relates to a method of manufacture of an electronic assembly comprising at least these steps: (i) Providing a substrate having at least a first contact area; (ii) Positioning a spot of a UV curable substance, e.g. an adhesive, on the substrate; (iii) Positioning an electrically conductive item on the substrate wherein the electrically conductive item is superimposed on the first contact area and on the spot of curable substance; (iv) Exposing the UV curable substance to UV irradiation, wherein a mechanical connection between the electrically conductive item and substrate is formed. One embodiment relates further to an electronic assembly comprising a substrate with a contact area, a spot of a cured substance on the substrate and an electrically conductive item, which electrically conductive item is in electrically conductive connection with the first contact area and mechanically connected through the spot of cured substance to the substrate, as well as uses of the UV curable substance.

BRIEF DESCRIPTION OF THE DRAWINGS

The following schematic drawings show aspects of the embodiment for improving the understanding of the embodiment in connection with some exemplary illustrations, wherein.

DETAILED DESCRIPTION

Figure 1:
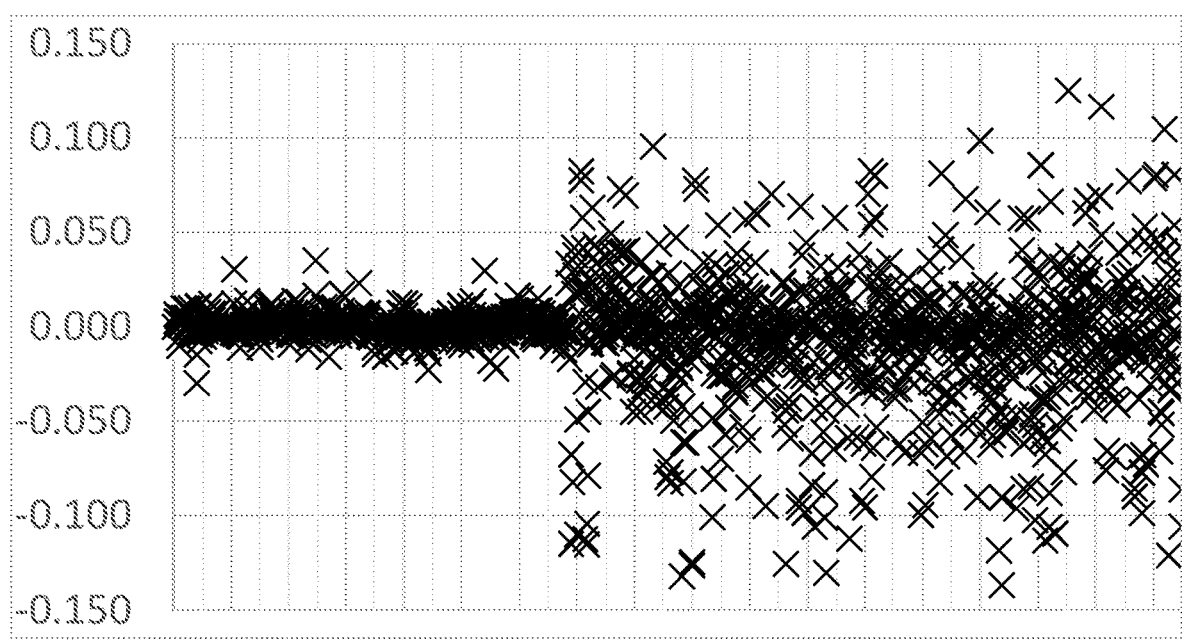
FIG. 1 illustrates two charts which display the deviation of a wire after thermal curing compared with the positioning prior to the thermal curing.

In the following Detailed Description, reference is made to the accompanying drawings, which form a part hereof, and in which is shown by way of illustration specific embodiments in which the embodiment may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present embodiment. The following detailed description, therefore, is not to be taken in a limiting sense, and the scope of the present embodiment is defined by the appended claims.

It is to be understood that the features of the various exemplary embodiments described herein may be combined with each other, unless specifically noted otherwise.

It is an object of one embodiment to provide a method of manufacturing an electronic assembly with improved accuracy in positioning of electric and/or electronic components on a substrate.

Another object of one embodiment is a simplified positioning procedure yielding accurately mounted electronic parts on substrate at lower cost compared with known techniques. Another object of one embodiment is a faster mounting process for electric and electronic components on a substrate.

Another object of one embodiment is to improve the throughput of a process for manufacture of electric and electronic assemblies.

Another object of one embodiment is to reduce the thermal stress applied to an electronic assembly during the mounting.

Another object of one embodiment is to reduce the number of misplaced items in a production.

Another object of one embodiment is an electronic assembly with higher accuracy in the mounted components.

Another object of one embodiment is to provide electronic assemblies with smaller features.

Another object of one embodiment is to provide electronic assemblies with improved packing density of mounted components.

Another object of one embodiment is to improve the mechanical stability of electrically conductive connections between mounted electric and electronic parts and the substrate.

Another object of one embodiment is to use UV curable substances to improve the positioning of mounted electric and electronic components.

General

Ranges mentioned in this description also include the values specified as limits. A range of the type "in the range from X to Y" in relation to a size A therefore means that A can assume the values X, Y and values between X and Y. Single sided limited ranges of the type "up to Y" for a size A are correspondingly interpreted as values Y and smaller than Y.

EMBODIMENTS

A contribution to at least partial achievement of at least one of the above objects is made by the independent claims. The dependent claims provide embodiments which contribute to at least partial achievement of at least one of the objects.

|1| A method of manufacture of an electronic assembly comprising at least these steps:
  (i) Providing a substrate having at least a first contact area;
  (ii) Positioning a spot of a UV curable substance on the substrate;
  (iii) Positioning an electrically conductive item on the substrate wherein the electrically conductive item is superimposed on the first contact area and on the spot of curable substance;
  (iv) Exposing the UV curable substance to UV irradiation, wherein a mechanical connection between the electrically conductive item and substrate is formed.

|2| The method according to embodiment |1|, wherein the method further comprises a step (v) after step (iv):
  (v) Connecting the first contact area with the electrically conductive item.

|3| The method according to embodiment 1 or 2, wherein the positioning of the electrically conductive item on the substrate in step (iii) is performed using a gripper.

|4| The method according to any one of the preceding embodiments, wherein the UV curable substance is selected from the group consisting of methacrylate esters, modified acrylic polymers and acrylated urethane.

|5| The method according to any one of the preceding embodiments, wherein the positioning is automated.

|6| The method according to any one of the preceding embodiments, wherein the electrically conductive item is selected from the group consisting of a wire, a stranded wire, a sheet of metal, a sheet of an alloy and a composite.

|7| An electronic assembly comprising as assembly components at least a substrate and an electrically conductive item,
  wherein the substrate has at least a first contact area and a spot of a cured substance;
  wherein the electrically conductive item is in electrically conductive connection with the first contact area and mechanically connected to the substrate through the spot of a cured substance.

|8| The electronic assembly of embodiment |7|, wherein the electrically conductive item is mechanically connected to the substrate.

|9| The electronic assembly of any one of embodiments |7| or |8|, wherein the electronic assembly is part of a sensor, an integrated circuit or a device comprising electronic circuitry.

|10| The electronic assembly of any one of embodiments |7| to |9|, wherein the electrically conductive item is selected from the group consisting of a wire, a stranded wire, a sheet of metal, a sheet of an alloy and a composite.

|11| A use of a UV-curable substance to control the position of an electrically conductive item of an electronic assembly.

|12| A use of a UV-curable substance to achieve at least one improvement selected from the group consisting of:
  a) higher accuracy of positioning of electric or electronic components on a substrate;
  b) simplified positioning procedure of electric or electronic components on a substrate;
  c) accelerated mounting process of electric or electronic components on a substrate;
  d) reduced the thermal stress applied to an electronic assembly;
  e) avoiding movement of the electric components on a substrate during the processing steps after the positioning of the electric component;
  or a combination of two or more of the thereof.

General

Ranges mentioned in this description also include the values specified as limits. A range of the type "in the range from X to Y" in relation to a size A therefore means that A can assume the values X, Y and values between X and Y. Single sided limited ranges of the type "up to Y" for a size A are correspondingly interpreted as values Y and smaller than Y.

A contribution to at least partial achievement of at least one of the above objects is made by the independent claims. The dependent claims provide embodiments which contribute to at least partial achievement of at least one of the objects.

A first aspect is a method of manufacture of an electronic assembly comprising at least these steps:
  (i) Providing a substrate having at least a first contact area;
  (ii) Positioning a spot of a UV curable substance [adhesive] on the substrate;
  (iii) Positioning an electrically conductive item on the substrate wherein the electrically conductive item is superimposed on the first contact area and on the spot of curable substance;
  (iv) Exposing the UV curable substance to UV irradiation, wherein a mechanical connection between the electrically conductive item and substrate is formed.

A first embodiment of the first aspect may include a further step (v) after step (iv), wherein step (v) is connecting the first contact area with the electrically conductive item.

The electronic assembly can be of any kind known to and considered suited by a skilled person. For example, the electronic assembly may be any kind of electronic circuitry comprising a printed circuit board.

The substrate can be of any kind known to and considered suited by a skilled person. Examples of a substrate are a printed circuit board (PCB) and a flexible substrate comprising a layer of a conductive pattern.

The substrate has at least one, preferably a plurality of contact areas, for example two or more thereof. In any way, the substrate has at least a first contact area. A contact area in the present context describes an electrically conductive at least two-dimensional spot on the substrate which is designed to connect with at least one further electrically conductive item. Electrically conductive in the present context describes a material property that has an electric conductivity of $>=10^6$ S/m at a temperature of 25° C. Accordingly, an electrically non-conductive feature has an electric conductivity of less than $10^6$ S/m.

The UV curable substance can any kind of substance or mixture that is sensitive to and curable by UV irradiation known to a skilled person. Examples of suited UV curable substances are found within the acrylic polymers, such as methacrylate esters, modified acrylic polymers and acrylated urethane.

Commercial examples of UV curable substances are MP53037 (a fast curing UV adhesive, available from Adhesive Systems, Inc., Frankfort (IL), United States), Permabond UV670 (a fast curing UV adhesive with good impact resistance, available from Permabond Engineering Adhesives Ltd., Hampshire, UK) and Loctite 3525 (a medium viscosity, modified acrylic UV adhesive, available from Henkel AG & Co. KGaA, Heidelberg, Germany).

A spot in the present context refers to an area which covers about 0.05 to 5 mm² on a surface. A spot of this size of UV curable substance is usually equivalent to a deposition of a drop of about 0.008 to 8 mm³ of UV curable substance.

The term superimposed in the present context describes that an item is placed or laid over or above another item, e.g. a wire is superimposed on a contact area.

UV irradiation refers to electromagnetic irradiation having a peak wavelength in the range from 100 to 380 nm.

According to the present method, a step (i) relates to providing a substrate. One way of providing on an industrial scale can be performed by positioning the substrate on a moving belt which propagates the substrate throughout the whole mounting process, which includes a number of subsystems and routines.

Step (ii), positioning a spot of UV curable substance, can be performed by any technique known to and considered suited by a skilled person. For example, a viscous but liquid preparation of the substance can be deposited by a nozzle or by ink jet dispersion.

Next, an electrically conductive item is positioned in step (iii) on the substrate in a way that the electrically conductive item is superimposed on the first contact area and on the spot of UV curable substance. For example, the electrically conductive item is immerged in the spot of UV curable substance but solely superficially touches the contact area.

Then, the spot of UV curable substance is exposed to UV irradiation (step (iv)) which causes a solidification of the spot and yields a hardened substance. At the same time, a mechanical connection between the electrically conductive item and the substrate is formed which stabilizes the position of the electrically conductive item in this point.

In one embodiment, at least step (iii) is performed using a gripper. A gripper is a tool which can pick and place an item at a desired position. The gripper can be of any kind known to a skilled person and considered suited for performing the step. In a preferred option, the gripper operates in an automated manner and/or is part of an automated manufacturing line. Performing step (iii) using a gripper contributes further to a precise mounting with accurate, repetitive and reproducible results. The gripper may release the electrically conductive item after the item being fixed by the drop of UV glue in step (iv).

In another embodiment, the first contact area on which the electrically conductive item is positioned has a flat surface. Yet more preferred, the first contact area and the surface both form a flat surface. The second and/or further contact areas have also flat surfaces.

Exposing the UV curable substance to UV irradiation may include at least one of these features, preferably two or more thereof:
(a) A peak wavelength of UV irradiation in the range from 280 to 380 nm, e.g. from 330-380 nm, or around 360-380 nm;
(b) Exposure time in the range from 2 to 30 seconds, e.g. less than 20 seconds, or from 2 to 10 seconds;
(c) An intensity per cm² on surface in the range from 10 mW/cm² to >5000 mW/cm² at peak wavelength, e.g. in the range from 700 to 2000 mW/cm² at peak wavelength;
(d) Around room temperature, i.e. between 20 and 30° C.

Combinations of the above features may be applied, e.g. a combination of at least features (a), (b) and (c), e.g. UV irradiation of around 1500 mW/cm² at 365 nm peak wavelength, 10 seconds exposure time and at room temperature.

It is possible to adjust the position of the electrically conductive item with regard to the contact area until the desired configuration is reached. Then, the electrically conductive item and the first contact area are connected by suited means, whereby e.g. an electrically conductive connection is formed. Suited means in this context is any technique of contacting the electrically conductive item and the contact that is known to a skilled person and considered appropriate. For example, suited means could refer to soldering of solder or applying conductive adhesive.

Solder refers to a fusible metal alloy used to create a permanent bond between metal workpieces and is used in electronics. Typically solder has a melting point between 90 and 500° C. Solder may consist of one or more of these metals: lead, tin, copper, silver, bismuth, indium, zinc, antimony. Very often, solder include two, three or more metals.

Conductive adhesive refers to compositions which yield electrically conducting connections between two metal workpieces after hardening. Often, conductive adhesive includes about 80 wt. % of a conductive component, such as silver, nickel, copper or graphite. The remainder to 100 wt. % can be a varnish, a synthetic resin or a silicone. An example of a conductive adhesive is EPO-TEK MED-H20E, which is available from Epoxy Technology, Inc., Billerica, Mass., USA.

As an embodiment, at least a part of spot of the UV curable substance is not superimposed on the contact area; for example, at least 75%, or 90% of the spot is not superimposed on the contact area, the % with respect to the area on the substrate covered by the spot.

The substrate may include a second and/or further contact areas. Then, the spot of UV curable adhesive may be positioned between to contact areas. The electrically conductive item could be configured to be electrically connected with only one of the contact areas, or with both contact areas. In the latter case, the electrically conductive item is first fixated by a spot of UV curable adhesive, which is UV cured by exposing to UV irradiation. Then the electrically conductive item is connected by solder or an electrically conductive adhesive to both contact areas. The electrical connection is established thermally when using solder.

It is further possible to position the parts in an automated manner.

The electrically conductive item can be of any kind which is known to a skilled person and considered suited in the present context. The electrically conductive item can be flexible, light, or a combination of both. Flexible refers to an item's property that the item may be bended by exertion of a force but reverts into its original shape when the force is removed. Light describes an item, the weight of which is 10 mg or less, e.g. 5 mg, but often at least 1 mg. In particular, a wire is considered light when it has a weight of 10 mg or less, e.g. at a wire length of about 2 cm.

Examples of suited electrically conductive items are selected from the group consisting of a wire, a stranded wire, a sheet of metal or alloy, and a composite. A wire can be made from a metal or alloy. A stranded wire includes two or more strands of metal or alloy which are bundled or wrapped together.

A composite is an object which includes at least a first and a further layer. The first layer is made from a non-conductive material, for example a foil of polyimide. The at least one further layer includes at an electrically conductive material, such as at least one selected from the group consisting of silver, platinum, copper, printed silver chloride, or a combination of two or more thereof. An example of a composite is a foil of polyimide which carries a layer of platinum, or silver, or silver chloride. Another suited composite may be a polyimide which is coated with silver and a layer of silver chloride on top.

The composite may be flat or flexible, or both. Flat in the present context refers to a shape of an item, where the item extends less than 1 tenth in size in a first direction compared with the other two directions perpendicular to the first one.

A second aspect is an electronic assembly obtainable by the process of the first aspect or one of its embodiments.

A third aspect is an electronic assembly comprising as assembly components at least a substrate and an electrically conductive item, wherein the substrate has at least a first contact area and a spot of a cured substance; wherein the electrically conductive item is in electrically conductive connection with the first contact area and mechanically connected to the substrate by the spot of a cured substance.

The embodiments described with regard to the first aspect are also embodiments of for the third aspect.

The cured substance can be obtained by UV curing, i.e. exposing to UV irradiation, a UV curable substance, for example at least one, or a combination of two or more of those described in the first aspect.

The cured substance forms a link between the electrically conductive item and the substrate. If the electrically conductive item is a wire or a stranded wire, the cured substance may have a pyramidal shape where the wire at the top of the pyramid is enclosed by the cured substance by at least one quarter with regard to its circumference. Moreover, the wire and the stranded wire may be enclosed further by the cured substance, e.g. by about a half, by about three quarters or completely. If the electrically conductive item is a sheet or a composite, for example, a flat item, then the contact area may be more than 2'500 μm, where the cured substance covers the contact area and attaches to the sheet or composite.

The electronic assembly of the second aspect can be configured in a way, where the electronic component is mechanically connected to the substrate. A mechanical connection may be established by a spot of the cured substance.

The electronic assembly may be part of a sensor, an integrated circuit, a device comprising electronic circuitry and the like.

The electrically conductive item in the third aspect can be the same as described before, in particular an item selected from the group consisting of a wire, a stranded wire, a sheet of metal, a sheet of an alloy and a composite.

A fourth aspect is a use of a UV-curable substance to control the position of an electrically conductive item of an electronic assembly. By design, the control of the position is not subject to removal during any further process steps through which the electronic assembly runs during fabrication. For example, the UV curable substance is UV cured during the use and remains as mechanical connection point after production of the electronic assembly and throughout lifetime of the electronic assembly.

A fifth aspect is a use of a UV-curable substance to achieve at least one improvement selected from the group consisting of:
 a) higher accuracy of positioning of electric or electronic components on a substrate, which is preferably part of an electronic assembly like those described herein;
 b) simplified positioning procedure of electric or electronic components on a substrate, which is preferably part of an electronic assembly like those described herein;
 c) accelerated mounting process of electric or electronic components on a substrate, which is preferably part of an electronic assembly like those described herein;
 d) reduced the thermal stress applied to an electronic assembly as those described herein;
 e) avoiding movement of electric components on a substrate during the processing steps after positioning of the electric component;
or a combination of two or more of the thereof.

FIG. 1 illustrates a chart where each data point corresponds to an assembly of an electrically conductive wire which was positioned on and connected to an electrically conductive contact pad on the substrate. The data points on the rights side correspond to said 300 runs of manufacture without using a UV fixing glue prior to connecting to the conductive pad, whereas the data points on the left side correspond to 300 runs of manufacture including a step of positioning and fixating of a wire with a UV sensitive glue on the substrate prior to forming the electrically conductive connection with the contact pad. The vertical axis is in millimeters [mm] and displays the offset between the position of the wire after electrically connecting to the conductive contact pad relative to the position of the wire on the conductive contact pad prior to the electrical connecting step, for each run. The offset is determined in a distance up to the full length of the wire from the electrical connection between the contact pad and the wire's end, at the point where the position of the wire deviates most from the expected position, perpendicular to the line of perfect position. If the wire is electrically connected to more than one contact pad on the substrate, the distance is from the last electrical connection until the end of the wire, i.e. on the part of the wire which is not further fixated. On the left side, the spread is in the range of 0.020 mm with 6 of 300 runs having an offset of >0.020 mm. The right side illustrates frequent offset of position for up to 0.1 mm and occasional offset of >0.1 mm to 0.2 mm. One offset on the right side is about 0.250 mm.

Figure 2:
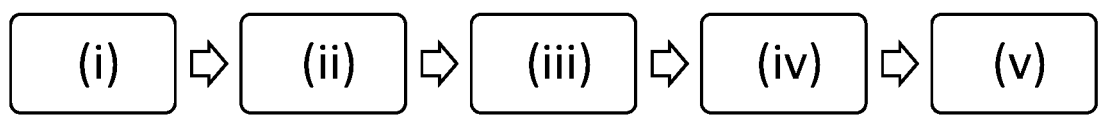
FIG. 2 illustrates a schematic of a method of manufacture.

FIG. 2 illustrates schematically the process of one embodiment with: step (i) providing a substrate having at least a first contact area; (ii) Positioning a spot of a UV curable substance on the substrate; (iii) Positioning an electrically conductive item on the substrate wherein the electrically conductive item is superimposed on the first contact area and on the spot of curable substance; (iv) Exposing the UV curable substance to UV irradiation, wherein a mechanical connection between the electrically conductive item and substrate is formed; and (v) Connecting the first contact area with the electrically conductive item.

Figure 3:
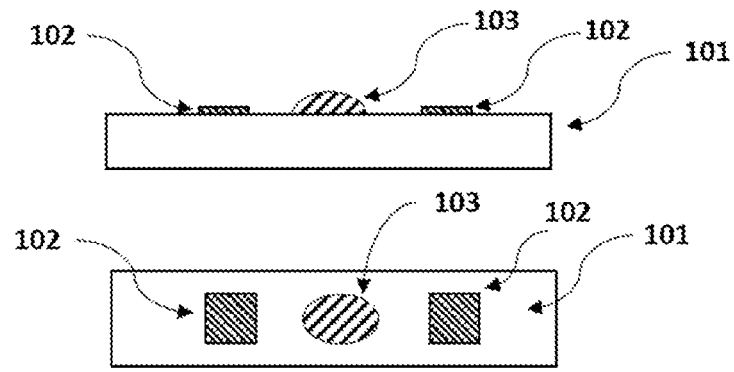
FIG. 3 illustrates a substrate a) prior to component placement, b) with preliminary component placement using UV adhesive and c) in final configuration after applying the solder or conducting adhesive (side and top view).
Figure 3:
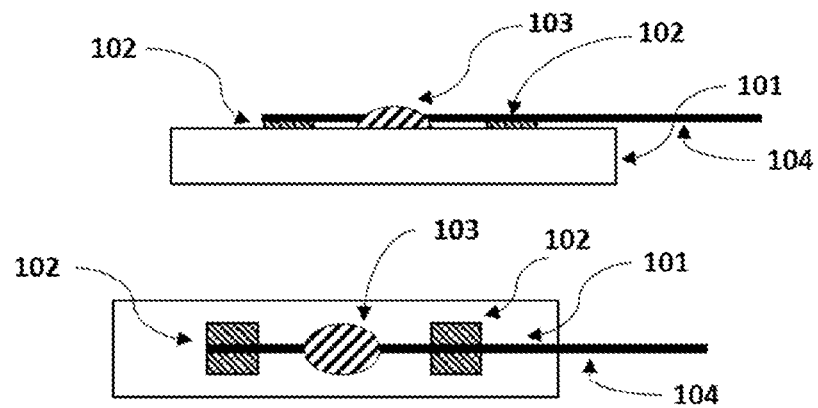
Figure 3:
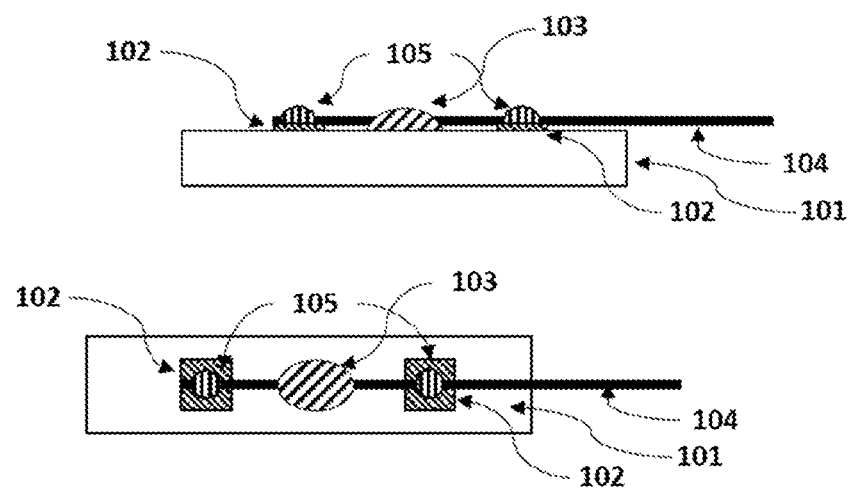

FIG. 3 illustrates always in sideview and top view a) a substrate 101 with a first and a second contact pad 102 and a spot of glue 103, which is positioned between the two contact pads 102. b) is as a). Further, a wire 104 is positioned, so that the wire superimposes on the two contact pads 102. c) is as b), further, the wire 104 is connected to each two contact pads 102 via a spot of electronic solder 105. Instead of solder, a conducting glue can be used (not illustrated here).

Figure 4:
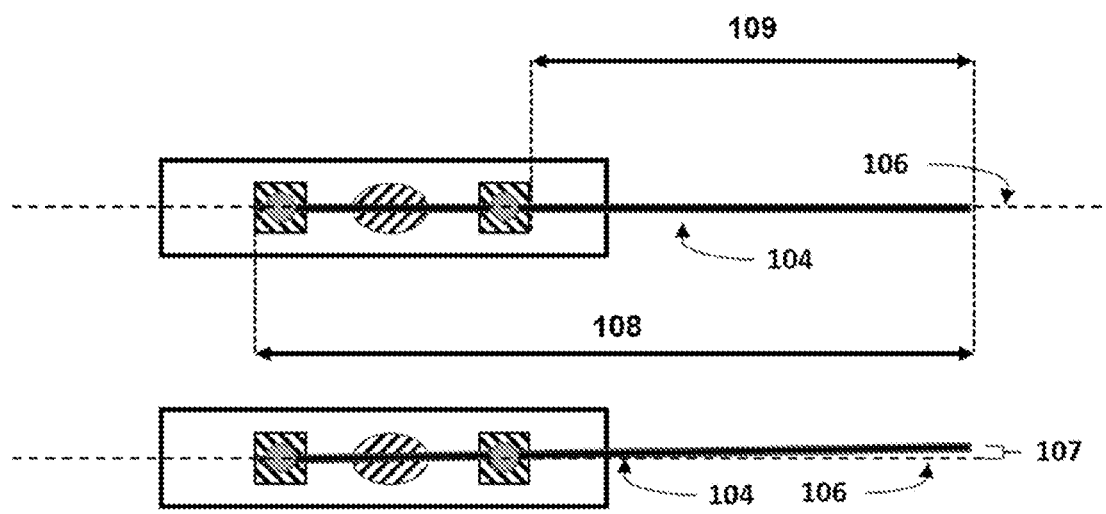
FIG. 4 illustrates schematically the way of testing the accuracy of an assembly.

FIG. 4 illustrates schematically the way of determination of the accuracy of an assembly. Reference numerals as in FIG. 3. 106 is an imaginary straight line which is identical with the positioning of the wire prior to connecting the solder pads. 107 visualizes a discrepancy between the position of the wire prior to assembly and the position of the wire after the assembly. The smaller this discrepancy the better is the accuracy of the assembly. 108 indicates the length of the wire 104 and 109 the distance between the frontmost contact pad 102 and the end of the wire 104.

Test Methods

The following test methods were used for the purposes of the embodiment. Unless otherwise stated the measurements were made at ambient temperature 25° C., ambient air pressure 100 kPa (0.986 atm) and relative humidity 50%.

A. Positional Accuracy

The positional accuracy of the assemblies illustrated in FIG. 1 was assessed by optical inspection of the assemblies. In this course the position of a wire on a substrate prior to assembly and the position the wire on the substrate after the assembly were compared (see FIG. 4). A Keyence VHX-5000 digital microscope with an integrated measuring system was used for the measurement. The distance between the part of the wire attached to the substrate which was the furthest from the expected position and its intended position was recorded (see FIG. 4 and description of FIG. 4).

EXAMPLES

Embodiments are described in more detail below via Examples and drawings, wherein the Examples and drawings do not imply any restriction of the embodiments. The drawings are moreover diagrammatic and not true to scale.

Example 1

Accuracy of mounting wires using a spot of UV curable adhesive in a first step was investigated.

These materials were used:

Substrate: FR4 (e.g. electroless nickel immersion gold (ENIG) FR4 prototype boards supplied by Roth Elektronik GmbH, 20537 Hamburg, Germany), 0.5 mm×2 mm×10 mm, with two conducting pads on surface having 1×1 mm area and a distance of 5 mm from each other. The conducting pads are made from copper-nickel-gold alloy. FR-4 is a composite material composed of woven fiberglass cloth with an epoxy resin binder that is flame resistant (self-extinguishing) most commonly used for printed circuit boards.

Wire: platinum core with polyimide coating. Silver layer on top of polyimide. Length 2 cm, diameter about 400 µm Conductive adhesive: Henkel Med H20E, available from Henkel AG & Co KG, Dusseldorf, Germany UV glue: MP 530374, available from Adhesive Systems, Inc., Frankfort (IL), United Stated A drop of UV glue (min 500 µm in diameter) is dispensed on top of the substrate in the middle between the two conducting pads. The wire is placed on top of the substrate overlapping the pads, and immerging into the UV glue drop using a gripper. The UV glue is cured by exposure to 365 nm UV light (intensity of 1000 mW/cm$^2$ on the drop) for a minimum of 10 seconds. The wire is released from the gripper. A drop of conductive adhesive is dispensed in the area where the wire overlaps the conducting pads. The conductive adhesive drops need to be a minimum 800 µm in diameter. The whole assembly is moved to a 150° C. over for 1 hour to cure the conductive adhesive. For comparison, the same procedure was performed but without dispensing a drop of UV between the two conducting pads.

The positions of the wire between placement using a gripper and its final position after curing the conductive adhesive were measured. 300 data points for each example were collected and printed in a chart (x-axis: no of data point; y-axis: shift of wire, i.e. delta of final position and set position), see FIG. 1. Data points of samples with UV adhesive are on the left side, those without on the right side. It is apparent that deviation from the ideal (y=0) is much lower for data points selected from samples with UV adhesive.

While the embodiment has been described in detail and with reference to specific embodiments thereof, it will be apparent to one skilled in the art that various changes and modifications can be made therein without departing from the spirit and scope thereof. Thus, it is intended that the embodiment covers the modifications and variations of this embodiment provided they come within the scope of the appended claims and their equivalents.

The invention claimed is:

1. A method of manufacture of an electronic assembly comprising the following steps in the following sequence:
   (i) providing a substrate having at least a first contact area;
   (ii) positioning a spot of a UV curable substance on the substrate;
   (iii) positioning an electrically conductive item on the substrate wherein the electrically conductive item is superimposed on the first contact area and on the spot of UV curable substance;
   (iv) exposing the spot of UV curable substance to UV irradiation, wherein a mechanical connection between the electrically conductive item and substrate is formed; and
   (v) electrically connecting the first contact area with the electrically conductive item.

2. The method according to claim 1, wherein the positioning of the electrically conductive item on the substrate in (iii) is performed using a gripper.

3. The method according to claim 1, wherein the UV curable substance is selected from a group consisting of methacrylate esters, modified acrylic polymers and acrylated urethane.

4. The method according to claim 1, wherein the positioning is automated.

5. The method according to claim 1, wherein the electrically conductive item is selected from a group consisting of a wire, a stranded wire, a sheet of metal, a sheet of an alloy and a composite.

6. The method according to claim 1, wherein the electrically conductive connection is formed by soldering of solder or applying a conductive adhesive.

* * * * *